United States Patent [19]

Le Poole et al.

[11] Patent Number: 4,691,103
[45] Date of Patent: Sep. 1, 1987

[54] MICROSCOPE FOR NON-DIFFERENTIATED PHASE IMAGE FORMATION

[75] Inventors: Jan B. Le Poole, Tucson, Ariz.; Nicolaas H. Dekkers, Eindhoven, Netherlands

[73] Assignee: U.S. Philips Corporation, New York, N.Y.

[21] Appl. No.: 757,998

[22] Filed: Jul. 23, 1985

[30] Foreign Application Priority Data

Jul. 25, 1984 [NL] Netherlands ......................... 8402340

[51] Int. Cl.⁴ ............................................ H01J 37/28
[52] U.S. Cl. .................................... 250/311; 250/307; 250/397
[58] Field of Search ............... 250/311, 310, 397, 307, 250/309; 350/507; 73/619

[56] References Cited

FOREIGN PATENT DOCUMENTS 2019691A 10/1979 United Kingdom .

Primary Examiner—Craig E. Church
Assistant Examiner—Jack I. Berman
Attorney, Agent, or Firm—Paul R. Miller

[57] ABSTRACT

The scanning system of a scanning microscope for the imaging of phase structures is adapted to form a scanning pattern which is free from discontinuities. The detector is divided into a number of sub-regions with the direction of the dividing lines of the detector being adapted to the scanning pattern. The scanning pattern is notably meander-shaped and the detector is divided into four quadrants. The deflection system is digitally controlled and the microscope may be an electron microscope.

15 Claims, 4 Drawing Figures

U.S. Patent  Sep. 1, 1987  4,691,103
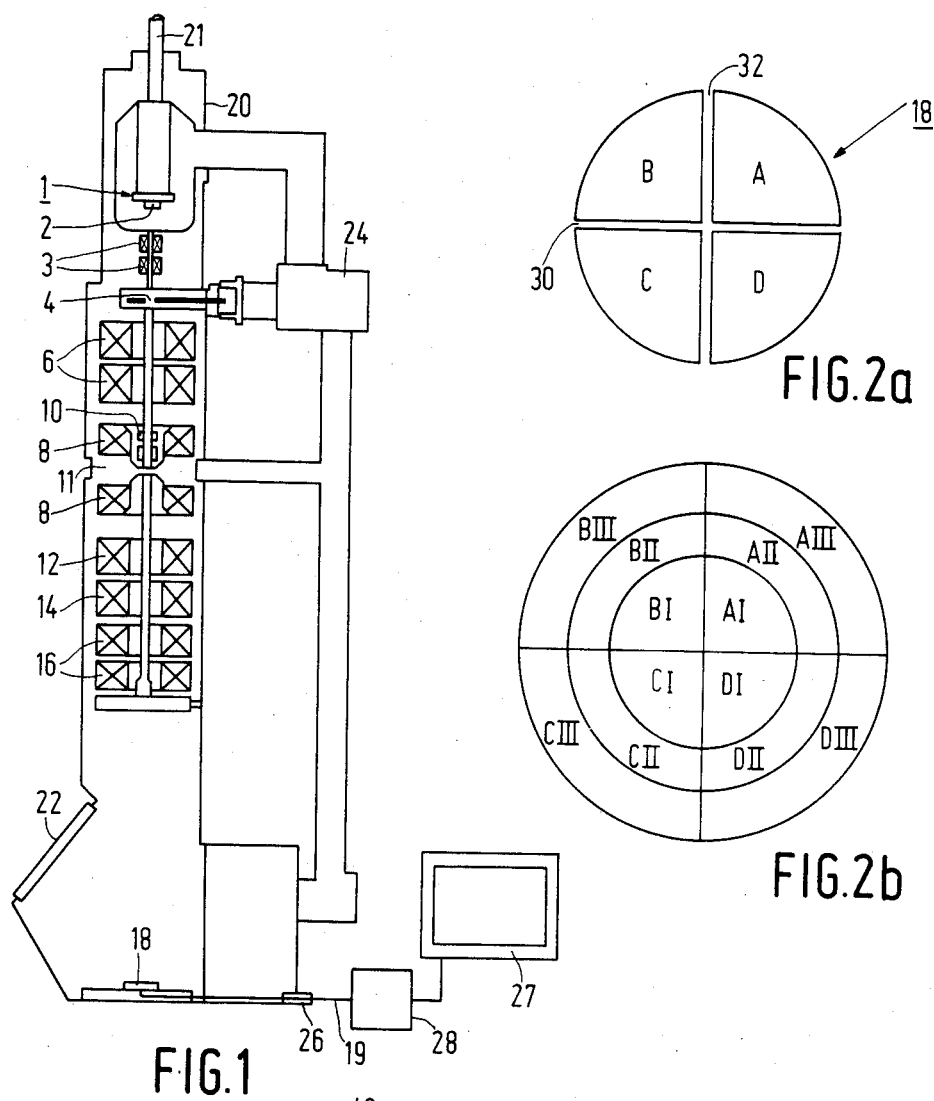
FIG.1
FIG.2a
FIG.2b
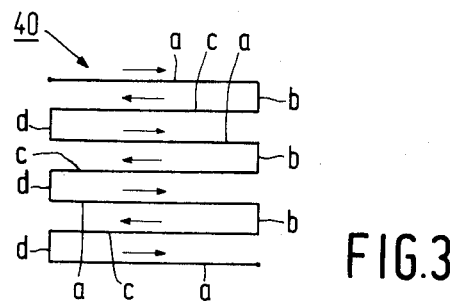
FIG.3
PHN 11.113

MICROSCOPE FOR NON-DIFFERENTIATED PHASE IMAGE FORMATION

The invention relates to a microscope comprising a radiation source, a lens system, a beam deflection system, a radiation detector which is divided into a plurality of separately readable elements, and a detector read-out system.

Such a microscope is known in the form of an electron microscope from British patent application No. 2,019,691. A method described therein for realizing non-differentiated phase images has not found practical use because problems are encountered during the necessary detector signal integration during the flyback of the scanning beam. Due to this discontinuity, the starting value of the intensity is unknown for each of the image lines.

It is the object of the invention to mitigate this drawback. To achieve this, a microscope of the kind set forth in accordance with the invention is characterized in that the beam scanning device is adapted to form a scanning pattern which is free from discontinuities with the detector being adapted to the scanning pattern so that separate signals can be recorded for each desirable line segment of the scanning pattern.

Because the occurrence of discontinuities during scanning is avoided in a microscope in accordance with the invention, the drawbacks no longer occur during signal integration and a reliable non-differentiated phase contrast image can be realized.

In a preferred embodiment the scanning pattern is meander-shaped because at the end of each line the scanning electron beam is shifted at right angles to the line direction over one line distance. The detector is divided into substantially four quadrants with dividing lines extending parallel to scanning line segments. For each of the quadrants the signals are applied to a signal read-out and processing system which comprises a signal integrator at least in as far as the phase signals are concerned. Signals supplied by the signal read-out system are applied, for example, to a television monitor on which a phase image in non-differentiated form can be displayed. The control of the scanning system as well as of the signal processing system may be in digital form. Extremely exact synchronization is then ensured.

In a further embodiment the detector is divided into several annular portions, viewed in the radial direction, so that the signals can be read out in a wavelength-sensitive manner. The imaging of a phase structure can thus be further enhanced.

In a preferred embodiment the microscope is formed by an electron microscope. The detector is then formed by an electron detector, for example, as described in Optik, Vol. 41, No. 4, 1974, pp. 452-256 or in British patent application No. 2,019,691. The electron source then preferably comprises an electron-emissive element in the form of a semiconductor, preferably as described in U.S. Pat. No. 4,303,930. As a result use can be made of an electron beam having a comparatively high current density to enhance the imaging resolution.

A read-out system for such a microscope may comprise a signal recording system in which image signals can be stored, for example temporarily, for processing at a later stage.

Some preferred embodiments in accordance with the invention will be described in detail hereinafter with reference to the accompanying drawing. Therein:

FIG. 1 is a diagrammatic sectional view of an electron microscope in accordance with the invention, FIG. 2a and 2b show detector surfaces, viewed from the incident radiation beam and divided for use in accordance with the invention, FIG. 3 shows the continuous scanning lines of the invention.

An electron microscope as shown in FIG. 1 comprises an electron source 1 with an electron-emissive element 2, a beam alignment system 3 and a beam aperture 4, a condenser system 6, an objective lens 8, a beam scanning system 10, an object space 11, a diffraction lens 12, an intermediate lens 14, a projection lens 16 and an electron detector 18 with a signal output lead 19. All these components are accommodated in a housing 20 with an electrical supply lead 21 for the electron source, a viewing window 22 and a vacuum pumping device 24.

In accordance with the invention, the electron source comprises an electron-sensitive entrance surface as described in the article in Optik 41. The detector is notably constructed as a semiconductor detector which consists of, for example a matrix of electron-sensitive diodes, each of which can be separately read out but also in a partly combined manner. Each of the detector sections formed in this or another manner is separately connected, via a signal conductor 19, to an externally accessible connection 26. In order to prevent loss of information, notably for high frequencies, it may be advantageous to integrate the detector sections with at least a first signal amplifier stage. A first amplifier stage is then directly coupled to the relevant detector section or to each separate diode of a matrix of diodes and accommodated in the housing of the electron microscope. The control of the detector signals, for example, for adaptation to the changing of the scanning direction, for synchronization and the like, can then also be performed, for example, with signals following the first amplifier stage.

For the electron emitter of the electron source use can be made to good advantage of a so-called cold electrode as described in U.S. Pat. No. 4,303,930. Thermal problems can thus be avoided and, as has already been stated, an electron beam having a high current density can be generated. The electron microscope comprises a television monitor 27 for image display. After the appropriate processing in a signal read-out or processing circuit 28, signals derived from the detector 18 can be applied to the monitor. Using the processed signals, a real image, i.e. a non-differentiated image of the phase structure of the object can be displayed on the monitor 27. It will be apparent that, in addition to phase images, amplitude images of an object can also be formed and displayed on the monitor. As is also stated in the article in Optik 41, phase images and amplitude images of an object can be simultaneously recorded but separately displayed, for example via temporary image memories. Alternatively, a separate monitor may be provided for each type of image or a sub-field of a composite monitor may be provided for each type of image.

For the scanning of an object use is made of the beam scanning device 10 which is adapted in accordance with the invention for the scanning of an object in a pattern in which the customary discontinuities, actually the flyback via each scanning line, are avoided. In most cases it is merely necessary to modify the control of a customary scanning device slightly for this purpose. A meander pattern is an attractive scanning pattern for performing phase measurements in accordance with the invention. Such a pattern can be realized by shifting the scanning spot at the end of each scanning line slightly, in a direction at right angles to the line writing direction, to a starting point for a next scanning line. Successive scanning lines are then mutually parallel, but the lines are alternately written in the opposite direction. The control of the beam scanning system may then also be digital. A detector divided into four quadrants A, B, C and D as shown in FIG. 2a is arranged in the microscope so that a separating line 30 extends parallel to the scanning lines a and c as shown in FIG. 3. A separating line 32 of the detector 18 then extends parallel to the scanning lines b and d. The following signals are then derived from signals from the four detector quadrants A, B, C and D during scanning in a meander pattern.

| | |
|---|---|
| Sa = SA − SB − SC + SD | right→left |
| Sb = −SA − SB + SC + SD | top→bottom |
| Sc = −SA + SB + SC − SD | left→right |
| Sd = −SA − SB + SC + SD (=Sb) | top→bottom |
| Sf = SA + SB + SC + SD | sum signal. |

Sa, Sb, Sc and Sd represent signals associated with the scanning lines a, b, c and d while SA, SB, SC and SD represent signals from each of the detector quadrants. Finally, Sf is the sum signal of the four detector quadrant signals and represents the amplitude signal of the object. The signal SA to SD are integrated and the composite signal thus formed is applied to the monitor 27 as the non-differentiated phase signal of the object.

FIG. 2b shows a detector surface which is in principle divided into four quadrants again but which is also radially divided into different regions. For example, the quadrant A is divided into an inner region AI, a central region AII and an outer region AIII. Frequency-sensitive measurements can be performed by means of a detector thus sub-divided. The circuit 28 may be constructed so that the three regions per quadrant are recorded together or separately, as desired.

Phase measurements are important notably also for biological objects in which usually conglomerates occur for which the phase difference is often relatively small. The use of a comparatively high voltage, for example up to 300 kV, is then attractive because the shorter wavelength of the radiation can then be measured in a more sensitive manner. It has been found that phase difference resolution of approximately 1° is then feasible.

Even though the invention has been described with reference to an electron microscope, it can also be successfully used in light-optical or acoustic scanning microscopes. The scanning as well as the signal processing are performed in a similar manner therein. It will be apparent that the detection properties of the detector are to be adapted to the radiation used.

What is claimed is

1. A microscope comprising a radiation source, a lens system, a beam scanning system, a radiation detector divided into a plurality of separately readable elements, a detector read-out system, and a monitor system receiving signals from said detector read-out system;
wherein the improvement comprises said beam scanning system including means for forming a scanning pattern provided in a continuous pattern of connected line segments, said radiation detector detecting separate signals for each line segment of said scanning pattern to be recorded.

2. A microscope according to claim 1, wherein said scanning pattern is a continuous meander-shaped pattern, and wherein said radiation detector is divided into four quadrants along dividing lines extending parallel to respective ones of said line segments for said meander-shaped scanning pattern.

3. A microscope according to claim 1 or claim 2, wherein said beam scanning system includes means for digitally controlling said beam scanning system.

4. A microscope according to claim 3, wherein said radiation detector is subdivided into at least three radial sub-regions, and wherein frequency filters are added to said detector read-out system.

5. A microscope according to claim 4, wherein said detector is an electron radiation detector including a plurality of semiconductor elements.

6. A microscope according to claim 1, wherein said radiation source includes an electron emitter of semiconductor elements.

7. A microscope according to claim 1, wherein said detector read-out system includes an image memory means for temporary image storage.

8. A microscope according to claim 1 or claim 2, wherein said radiation detector is subdivided into at least three radial sub-regions, and wherein frequency filters are added to said detector read-out system.

9. A microscope according to claim 1, wherein said radiation detector is an electron detector including a plurality of semiconductor elements.

10. A microscope according to claim 1, wherein said radiation source includes an electron emitter of semiconductor elements.

11. A microscope according to claim 1 or claim 2, wherein said detector read-out system includes an image memory means for temporary image storage.

12. A microscope according to claim 1, wherein said beam scanning system provides said scanning pattern in a continuous meander-shaped pattern of said line segments, said beam scanning system providing each said line segment shifted at right angles to the preceding line segment at the end of each line segment.

13. A microscope according to claim 1 or claim 2, wherein said detector read-out system includes a signal integrator.

14. A microscope according to claim 1 or claim 2, wherein said monitor system includes a single monitor for each type of image provided by said detector read-out system.

15. A microscope according to claim 1 or claim 2, wherein said monitor system includes a composite monitor having a sub-field for displaying each type of image provided by said detector read-out system.

* * * * *

UNITED STATES PATENT AND TRADEMARK OFFICE
CERTIFICATE OF CORRECTION

PATENT NO. : 4,691,103                     Page 1 of 3
DATED      : September 1, 1987
INVENTOR(S): Jan B. Le Poole, et al It is certified that error appears in the above-identified patent and that said Letters Patent is hereby corrected as shown below:

<u>IN THE CLAIMS</u>

| | |
|---|---|
| Claim 1, line 1 | delete "A" insert --An electron-- |
| line 1 | delete "a radiation" insert --an electron-- |
| Claim 1, line 2 | delete "a radiation" insert --an electron-- |
| Claim 1, line 9 | delete "radiation" insert --electron-- |
| Claim 2, line 1 | delete "A" insert --An electron-- |
| line 3 | delete "radiation" insert --electron-- |
| Claim 3, line 1 | delete "A" insert --An electron-- |

UNITED STATES PATENT AND TRADEMARK OFFICE
CERTIFICATE OF CORRECTION

PATENT NO. : 4,691,103   Page 2 of 3
DATED : September 1, 1987
INVENTOR(S) : Jan B. Le Poole, et al It is certified that error appears in the above-identified patent and that said Letters Patent is hereby corrected as shown below:

IN THE CLAIMS

| | | |
|---|---|---|
| Claim 4, | line 1 | delete "A" insert --An electron-- |
| | line 2 | delete "radiation" insert --electron-- |
| Claim 5, | line 1 | delete "A" insert --An electron-- |
| Claim 7, | line 1 | delete "A" insert --An electron-- |
| Claim 8, | line 1 | delete "A" insert --An electron-- |
| | line 2 | delete "radiation" insert --electron-- |
| Claim 9, | line 1 | delete "A" insert --An electron-- |
| | line 2 | delete "radiation" insert --electron-- |

UNITED STATES PATENT AND TRADEMARK OFFICE
CERTIFICATE OF CORRECTION

PATENT NO. : 4,691,103
DATED : September 1, 1987
INVENTOR(S) : Jan B. Le Poole, et al It is certified that error appears in the above-identified patent and that said Letters Patent is hereby corrected as shown below:

IN THE CLAIMS

| | |
|---|---|
| Claim 10, line 1 | delete "A" insert --An electron-- |
| line 2 | delete "radiation" insert --electron-- |
| Claim 11, line 1 | delete "A" insert --An electron-- |
| Claim 12, line 1 | delete "A" insert --An electron-- |
| Claim 13, line 1 | delete "A" insert --An electron-- |
| Claim 14, line 1 | delete "A" insert --An electron-- |

Signed and Sealed this

Twentieth Day of September, 1988

*Attest:*

DONALD J. QUIGG

*Attesting Officer*     *Commissioner of Patents and Trademarks*